United States Patent
Kiryu (10) Patent No.: US 7,631,237 B2
(45) Date of Patent: Dec. 8, 2009

(54) MULTI-TEST METHOD FOR USING COMPARE MISR

(75) Inventor: Naoki Kiryu, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 444 days.

(21) Appl. No.: 11/134,923

(22) Filed: May 23, 2005

(65) Prior Publication Data

US 2006/0282732 A1    Dec. 14, 2006

(51) Int. Cl.
*G01R 31/28* (2006.01)

(52) U.S. Cl. ............... 714/736; 714/726; 714/728; 714/732; 714/738

(58) Field of Classification Search .............. None
See application file for complete search history.

(56) References Cited

U.S. PATENT DOCUMENTS

| | | | |
|---|---|---|---|
| 5,042,034 A * | 8/1991 | Correale et al. ............. | 714/727 |
| 5,617,426 A * | 4/1997 | Koenemann et al. ......... | 714/726 |
| 5,642,362 A * | 6/1997 | Savir ........................ | 714/726 |
| 5,652,754 A * | 7/1997 | Pizzica ...................... | 714/732 |
| 6,240,537 B1 | 5/2001 | Sim | |
| 6,311,311 B1 * | 10/2001 | Swaney et al. .............. | 716/4 |
| 6,393,594 B1 * | 5/2002 | Anderson et al. ........... | 714/738 |
| 6,671,839 B1 * | 12/2003 | Cote et al. .................. | 714/726 |
| 6,715,105 B1 * | 3/2004 | Rearick ...................... | 714/30 |
| 6,751,765 B1 * | 6/2004 | Rizzolo et al. .............. | 714/732 |
| 6,807,645 B2 * | 10/2004 | Angelotti et al. ............ | 714/732 |
| 6,950,974 B1 * | 9/2005 | Wohl et al. .................. | 714/733 |
| 6,971,054 B2 * | 11/2005 | Kurtulik et al. ............. | 714/732 |
| 6,996,758 B1 * | 2/2006 | Herron et al. ............... | 714/726 |
| 7,058,869 B2 * | 6/2006 | Abdel-Hafez et al. ....... | 714/729 |
| 7,257,745 B2 * | 8/2007 | Huott et al. ................. | 714/710 |
| 2002/0087931 A1 * | 7/2002 | Jaber ......................... | 714/733 |
| 2002/0125907 A1 * | 9/2002 | Kurtulik et al. ............. | 324/765 |
| 2003/0056164 A1 * | 3/2003 | Lauga ......................... | 714/726 |
| 2003/0115525 A1 * | 6/2003 | Hill et al. .................... | 714/726 |
| 2003/0149925 A1 * | 8/2003 | Angelotti et al. ............ | 714/726 |
| 2003/0163773 A1 * | 8/2003 | O'Brien et al. ............. | 714/726 |
| 2004/0139377 A1 * | 7/2004 | Barnhart et al. ............. | 714/726 |
| 2004/0153926 A1 * | 8/2004 | Abdel-Hafez et al. ....... | 714/726 |
| 2005/0160339 A1 * | 7/2005 | Forlenza et al. ............. | 714/733 |
| 2005/0240848 A1 * | 10/2005 | Cote et al. .................. | 714/726 |
| 2005/0240850 A1 * | 10/2005 | Ohwada et al. ............. | 714/738 |
| 2006/0020860 A1 * | 1/2006 | Tardif et al. ................. | 714/724 |
| 2006/0095820 A1 * | 5/2006 | Rich et al. ................... | 714/733 |
| 2006/0107149 A1 * | 5/2006 | Rich et al. ................... | 714/733 |
| 2006/0242502 A1 * | 10/2006 | Wang et al. ................. | 714/724 |

* cited by examiner

*Primary Examiner*—Kevin L Ellis
*Assistant Examiner*—Guerrier Merant
(74) *Attorney, Agent, or Firm*—Law Offices of Mark L. Berrier (57) ABSTRACT

Systems and methods for performing logic built-in-self-tests (LBISTs) where data comparisons are performed in the MISR. In one embodiment, a STUMPS-type LBIST architecture includes scan chains interposed between portions of the functional logic of the logic circuit. Test bit patterns are scanned into the scan chains, propagated through the functional logic, and captured in scan chains following the functional logic. The bits are scanned out of the scan chains into a self-compare MISR that creates a signature from the computed bit patterns and then compares the signature of the computed bit patterns with an expected signature, giving a pass/fail result. This single bit result reduces the bandwidth required to communicate the result(s) of the LBIST testing to the test equipment. As a result, a larger number of devices can be tested by a given piece of test equipment.

18 Claims, 8 Drawing Sheets

MULTI-TEST METHOD FOR USING COMPARE MISR

BACKGROUND

1. Field of the Invention

The invention relates generally to the testing of electronic circuits, and more particularly to systems and methods for increasing the number of devices having LBIST circuitry that can be tested at the same time by reducing the number of necessary connections between the devices under test and a test system.

2. Related Art

Digital devices are becoming increasingly complex. As the complexity of these devices increases, there are more and more chances for defects that may impair or impede proper operation of the devices. The testing of these devices is therefore becoming increasingly important.

Testing of a device may be important at various stages, including in the design of the device, in the manufacturing of the device, and in the operation of the device. Testing at the design stage ensures that the design is conceptually sound. Testing during the manufacturing stage may be performed to ensure that the timing, proper operation and performance of the device are as expected. Finally, after the device is manufactured, it may be necessary to test the device at normal operating speeds to ensure that it continues to operate properly during normal usage.

One way to test for defects in a logic circuit is to deterministic approach. In a deterministic method, each possible input pattern is applied at the inputs of the logic circuit, with each possible set of state values in the circuit. The output pattern generated by each set of inputs and state values is then compared with the expected output pattern to determine whether the logic circuit operated properly. If the number of possible input patterns and state values is high, however, the cost of deterministic testing of all the combinations is generally too high for this methodology to be practical. An alternative method of testing that has a lower cost is therefore desirable.

One alternative is a non-deterministic approach in which pseudorandom input test patterns are applied to the inputs of the logic circuit. The outputs of the logic circuit are then compared to the outputs generated in response to the same pseudorandom input test patterns by a logic circuit that is known to operate properly. If the outputs are the same, there is a high probability that the logic circuit being tested also operates properly. The more input test patterns that are applied to the logic circuits, and the more random the input test patterns, the greater the probability that the logic circuit under test will operate properly in response to any given input pattern. This non-deterministic testing approach is typically easier and less expensive to implement than a deterministic approach.

One test mechanism that can be used to implement a deterministic testing approach is a built-in self test (BIST). This may also be referred to as a logic built-in self test (LBIST) when applied to logic circuits. BIST and LBIST methodologies are generally considered part of a group of methodologies referred to as design-for-test (DFT) methodologies. DFT methodologies impact the actual designs of the circuits that are to be tested. LBIST methodologies in particular involve incorporating circuit components into the design of the circuit to be tested, where the additional circuit components are used for purposes of testing the operation of the circuit's logic gates.

In a typical LBIST system, LBIST circuitry within a device under test includes a plurality of scan chains interposed between levels of the functional logic of the device. The automated test equipment or the LBIST circuitry provides input bit patterns that are scanned into the scan chains and then propagated through the functional logic to subsequent scan chains. The computed bits (the bits that are propagated through the functional logic) are then scanned out of the scan chains into a multiple-input signature register (MISR,) where the computed bits from the scan chains are combined into a test signature. The size of the signature is equal to one bit for each of the scan chains). This test cycle is typically repeated many times (e.g., 10,000 iterations,) with the results of each test cycle being combined in some manner with the results of the previous test cycles. After all of the scheduled test cycles have been completed, the final result (the test signature) is passed back to the automated test equipment to be compared to a final result generated by a device that is know to operate properly. Based on this comparison, it is determined whether the device under test operates properly.

This conventional configuration has some drawbacks, however. Each of the devices requires a number of connections for support such as power and control signals, for input such as the test patterns, and for output such as the computed test results. The total number of connections not only scales with the number of devices but, as in the case of the device output, with the number of scan chains within the LBIST circuitry.

It is typically desirable to be able to test multiple integrated circuits at the same time on a single test system. The test system can normally make a limited number of connections to the integrated circuits under test. Because of the large number of pins that may be required for each device, however, the number of devices that can be tested at a single time may be severely limited.

It would therefore be desirable to provide systems and methods for decreasing the number of pins/connections required by each of the devices, thereby increasing the number of devices that can be coupled to a test system for performing LBIST testing on the devices.

SUMMARY OF THE INVENTION

One or more of the problems outlined above may be solved by the various embodiments of the invention. Broadly speaking, the invention includes systems and methods for performing logic built-in-self-tests (LBISTs) in digital circuits where data comparisons are performed in the MISR, thereby reducing the number of pins/connections that are required, and reducing the amount of processing that must be performed off-chip.

The invention may be implemented in a variety of ways, and various exemplary embodiments will be described in detail below. In one embodiment, a STUMPS-type LBIST test architecture is incorporated into the design of a logic circuit. The LBIST components include a set of scan chains interposed between portions of the functional logic of the logic circuit. Test bit patterns are scanned into the scan chains so that the test bit patterns can be propagated through the functional logic following the scan chains. The bit patterns resulting from the execution of the functional logic are captured in scan chains following the functional logic and then scanned out of these scan chains into a self-compare MISR. The self-compare MISR creates a signature from the computed bit patterns and then compares the signature of the computed bit patterns with an expected signature, giving a pass/fail result. This single bit result reduces the bandwidth required to communicate the result(s) of the LBIST testing to the test equipment. As a result, a larger number of devices can be tested by a given piece of test equipment.

An alternative embodiment comprises a system that can function either as a self-compare MISR or as a conventional MISR that incorporates mask registers. The operational mode of the device is set by the assertion of an appropriate combination of control signals. In this alternative embodiment, a STUMPS-type LBIST test architecture is incorporated into the design of a logic circuit as described above. The MISR in this embodiment creates a signature from the computed bit patterns and then either (a) acts as a conventional MISR that applies bits in a set of mask registers to the bits scanned out of the scan chains and outputs the signature of the computed bit patterns as the result or (b) acts as a self-compare MISR that compares the signature of the computed bit patterns with an expected signature, giving a pass/fail result. As a result, the device can support either mode of operation.

Another alternative embodiment comprises a test bit pattern generator, a MISR and a plurality of scan chains. The scan chains are interposed with functional logic of a device under test and are coupled between the test bit pattern generator and the MISR. The scan chains are configured to receive test bit patterns from the test bit pattern generator, temporarily store the test bit patterns and provide the test bit patterns to the functional logic. The scan chains also capture computed bit patterns that have propagated through the functional logic and provide the computed bit patterns and one or more expected bit patterns to the MISR. The MISR is configured to generate accumulated signature bit patterns based on the computed bit patterns. The MISR compares the accumulated signature bit patterns to corresponding expected bit patterns and generates a pass/fail signal based upon the comparisons.

Another alternative embodiment comprises a self-compare MISR including a set of inputs, a set of accumulated signature latches, accumulation circuitry and comparison circuitry. The inputs receive computed bits from corresponding scan chains. The accumulated signature latches store accumulated signature bits. The accumulation circuitry is configured to modify the accumulated signature bits according to bits received from the scan chains. The comparison circuitry is coupled to the latches and is configured to receive a set of expected bits, compare the expected bits to the accumulated signature bits and generate a pass/fail signal based upon the comparison of the expected bits to the accumulated signature bits.

Another alternative embodiment comprises a method including accumulating signature bits, receiving a expected bits corresponding to the signature bits, comparing each of the expected bits to the corresponding signature bits, and generating a pass/fail signal based upon the comparison of the expected bits to the accumulated signature bits.

Numerous additional embodiments are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for increasing the number of devices having LBIST circuitry that can be tested at the same time by reducing the number of necessary connections between the devices under test and a test system. Various embodiments may reduce the bandwidth required of the logic built-in-self-test (LBIST) circuitry and increase the number of devices that can be connected automated test equipment when performing logic built-in-self-tests. These benefits can be obtained by configuring the LBIST circuitry to perform evaluations of computed results within the same device ("on-chip").

In one embodiment, a STUMPS-type LBIST test architecture is incorporated into the design of a logic circuit. The LBIST components include a set of scan chains interposed between portions of the functional logic of the logic circuit. Test bit patterns are scanned into the scan chains so that the input test bit patterns can be propagated through the functional logic following the scan chains. The resulting bit patterns are captured in scan chains following the functional logic and then scanned out of these scan chains and into a self-compare MISR.

Also scanned through the scan chains and in to the MISR are the bits of an expected result. As the computed bits (the bits that are captured in the scan chains after having propagated through the functional logic) are scanned out of the scan chains, they are combined with the contents of the MISR, and the result is retained in the MISR. The retained bits provide a signature of the computed bits. One or more test cycles can be used to create the test signature. Periodically, each of the bits of the test signature in the MISR is compared to the corresponding bit in the expected result. These comparisons are then evaluated to determine if the circuitry malfunctioned, and a corresponding pass/fail bit is communicated to the test equipment. In one embodiment, the MISR is configured to alternately perform self-comparisons of the signature bits, or to mask bits of the various scan chains as they are received by the MISR.

The various embodiments of the invention may provide a number of advantages over conventional systems. For example, the bandwidth required of the test equipment is reduced and may then be used to support the testing of additional devices, thereby increasing the overall testing throughput.

Various embodiments of the invention will be described below. Primarily, these embodiments will focus on implementations of a STUMPS-type LBIST architecture which is implemented within an integrated circuit. It should be noted that these embodiments are intended to be illustrative rather than limiting, and alternative embodiments may be implemented in BIST architectures other than the STUMPS architecture, and may also be implemented in circuits whose components are not strictly limited to logic components (e.g., AND gates, OR gates, and the like). Many such variations will be apparent to persons of ordinary skill in the art of the invention and are intended to be encompassed by the appended claims.

Figure 1:
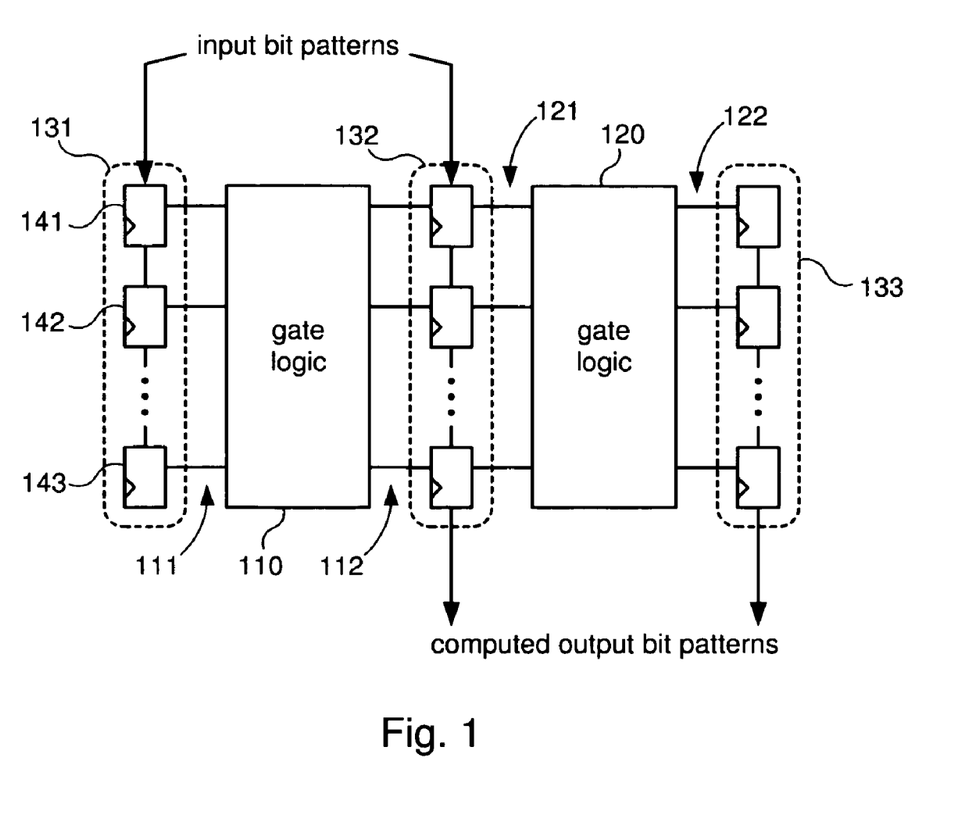
FIG. 1 is a functional block diagram illustrating the principal of operation of a simple STUMPS LBIST system.

Referring to FIG. 1 a functional block diagram illustrating the principal of operation of a simple STUMPS LBIST system is shown. The LBIST system is incorporated into an integrated circuit. In this figure, the functional logic of the integrated circuit includes a first portion 110 and a second portion 120. Functional logic 110 is, itself, a logic circuit having a plurality of inputs 111 and a plurality of outputs 112. Similarly, functional logic 120 forms a logic circuit having a plurality of inputs 121 and a plurality and outputs 122. Functional logic 110 is coupled to functional logic 120 so that, in normal operation, outputs 112 of functional logic 110 serve as inputs 121 to functional logic 120.

Each of the inputs to, and outputs from, functional logic 110 and 120 is coupled to a scan latch. The set of scan latches 131 that are coupled to inputs 111 of functional logic 110 forms one is referred to as a scan chain. The latches are serially coupled together so that bits of data can be shifted through the latches of a scan chain. For example, a bit may be scanned into latch 141, then shifted into latch 142, and so on, until it reaches latch 143. More specifically, as this bit is shifted from latch 141 into latch 142, a second bit is shifted into latch 141. As a bit is shifted out of each latch, another bit is shifted into the latch. In this manner, a series of data bits can be shifted, or scanned, into the set of latches in scan chain 131, so that each latch stores a corresponding bit. Data can likewise be scanned into the latches of scan chain 132.

Just as data can be scanned into the latches of a scan chain (e.g., 131,) data can be scanned out of the latches of a scan chain. As depicted in FIG. 1, the latches of scan chain 132 are coupled to the outputs of functional logic 110. Each of these latches can store a corresponding bit that is output by functional logic 110. After these output bits are stored in the latches of scan chain 132, the output data bits can be shifted through the series of latches and provided as an output bit stream. Data can likewise be scanned out of the latches of scan chain 133. It should be noted that the structure illustrated in FIG. 1 does not show data being scanned into scan chain 133, or data being scanned out of scan chain 131. Alternative embodiments may be configured to scan data in and out of these scan chains. For example, this may be needed when loading comparison data to a self-compare MISR.

The LBIST system of FIG. 1 operates basically as follows. Test bit patterns are generated and are scanned into the scan chains (131, 132) that are coupled to the inputs of functional logic 110 and 120. The input test bit patterns that are stored in scan chains 131 and 132 are then propagated through the corresponding functional logic. That is, the bit pattern in scan chain 131 is propagated through functional logic 110, while the bit pattern in scan chain 132 is propagated through functional logic 120. Functional logic 110 and 120 process the inputs and generate a corresponding set of outputs. These computed outputs are captured (stored) in the scan chains (132 and 133) that are coupled to the outputs of the functional logic. The computed output bit patterns stored in scan chains 132 and 133 are then scanned out of these scan chains.

The input bit patterns depicted in FIG. 1 are provided in one embodiment by automated test equipment (ATE). The ATE also provides support necessary to operate a device under test (DUT.) This support may include items such as timing signals from a PLL or an off-chip LBIST controller, power, input test bit patterns, and expected data signatures. The number of devices that can be tested is typically limited by the number of connections that are available on the ATE.

Figure 2:
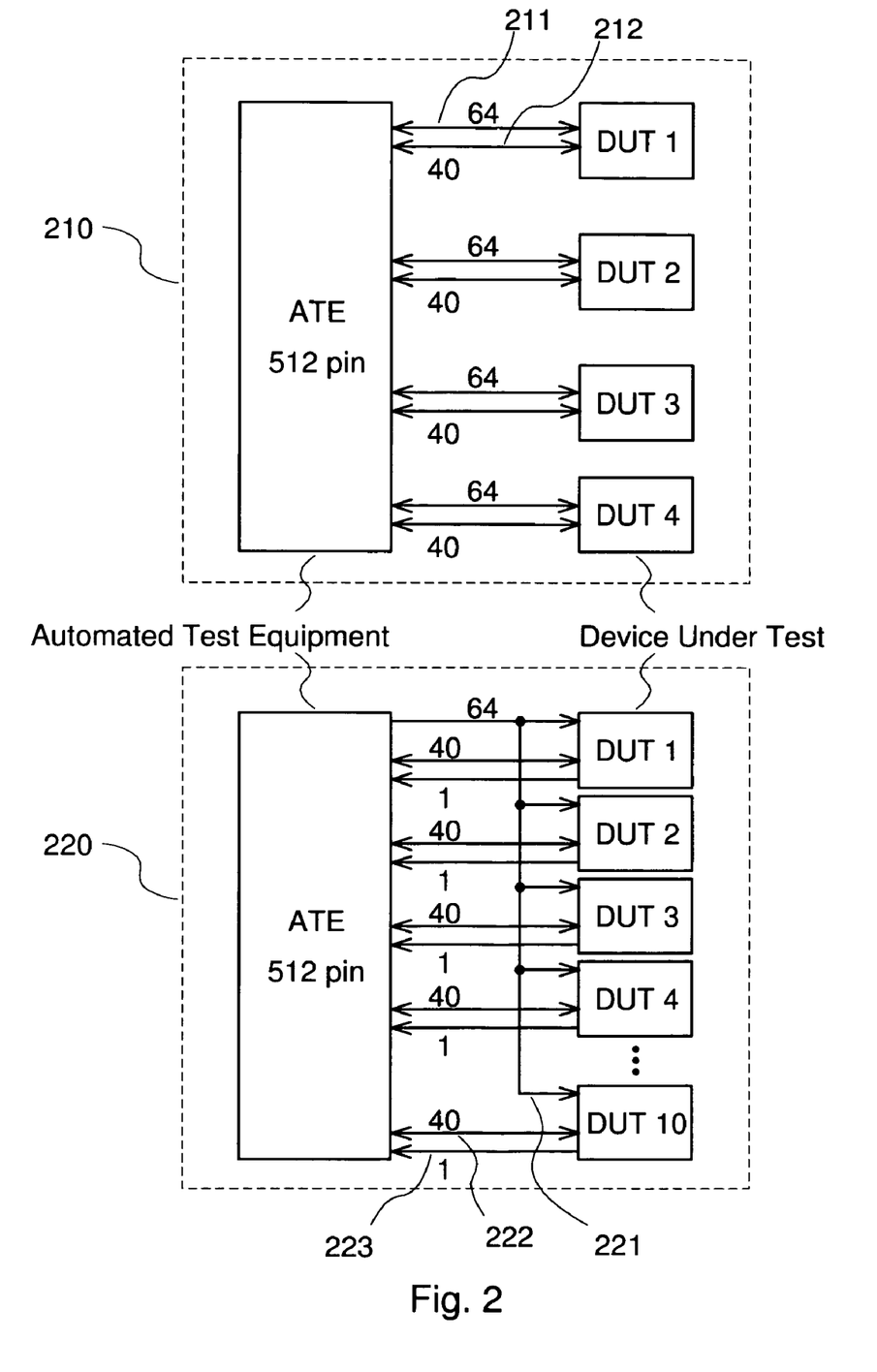
FIG. 2 is a block diagram illustrating the bandwidth requirements between automated test equipment and devices under test for both a conventional system and a system in accordance with one embodiment.

Referring to FIG. 2, two functional block diagrams illustrating the interconnection of a set of devices under test to automated test equipment in a conventional system and in one embodiment of the present invention are shown. The upper portion of the figure shows a conventional configuration, while the lower portion of the figure shows a configuration in accordance with the present embodiment. Each configuration includes a piece of automated test equipment and a number of devices under test. In the first configuration 210, a conventional system is depicted. The input and output bit patterns provided to a given DUT make use of the same pins/connections 211. Though the inputs for any two DUTs need not be the same, they would typically be the same. For the present configuration 220, the input and output pins/connections are arranged differently. All DUTs have dedicated input pins and share connections 221 with the ATE. (The inputs will therefore be the identical.) Each DUT also has a dedicated output pin that will carry a pass/fail signal from the DUT.

The number of DUTs that can be concurrently tested using these configurations can be illustrated by several examples. The illustrative configurations include the conventional system and an embodiment of the invention. As in FIG. 2, all of the example DUTs require an input bandwidth of 64 bits to acquire test bit patterns as well as 40 pins/connections for general support (e.g. power, clock signals, etc.). The ATE used in the examples has 512 connections. With the exception of the embodiment of the invention (associated with column D of TABLE 1) the ATE evaluates the output bit pattern signatures computed in the functional logic of the DUT. In the embodiment of the invention, the comparison of the signatures is performed by the MISR.

A DUT having a first configuration includes 64 input pins to provide input bit patterns to the scan chains and 64 output pins to output the signature of the MISR. This configuration also includes 40 pins for other support, for a total of 168 pins requiring 168 ATE connections. An ATE with 512 connections could support no more than three such devices. Conventional systems (such as 210, illustrated in FIG. 2) increase the number of DUTs by using the same 64 pins for both the input and output of the LBIST data 211. The number of connections is thus reduced to only 104 per DUT, although the bandwidth is also reduced by the sharing of the I/O pins. An ATE with 512 connections could support four such devices. Both of these examples are listed in TABLE 1, columns A and B, respectively.

An exemplary embodiment of the invention (such as 220, illustrated in FIG. 2) requires 64 input pins 221, 1 output pin 223, and 40 support pins 222. When implemented such that the same 64 input connections of the ATE are shared by all DUTs, ten DUTs would have 474 connections and could be tested with a 512-connection ATE. See column D, TABLE 1. It should be noted that the sharing of the ATE input connections alone is not sufficient to achieve this increase in DUTs, as shown by the example of column C, TABLE 1.

TABLE 1

|  |  | A | B | C | D |
|---|---|---|---|---|---|
| Number of DUT for 512 pin ATE |  | 3 | 4 | 4 | 10 |
| Number of ATE connections required | DUT support | 3 × 40 | 4 × 40 | 4 × 40 | 10 × 40 |
|  | DUT input | 3 × 64 | 4 × 64 | 1 × 64 | 1 × 64 |
|  | DUT output | 3 × 64 | 0** | 4 × 64 | 10 × 1 |
|  | Total | 504 | 416 | 480 | 474 |

**the output shares pins with the input

Figure 3:
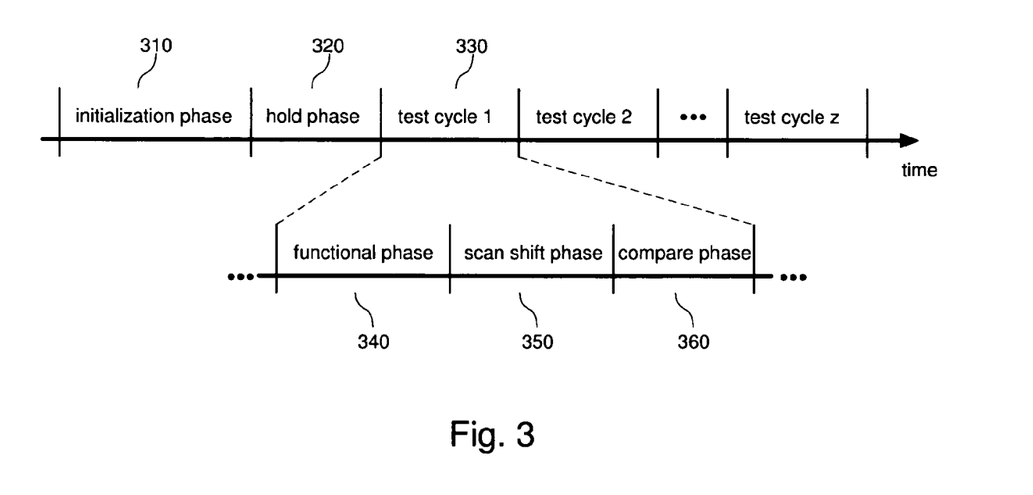
FIG. 3 is a diagram illustrating the phases of operation of an LBIST system in accordance with one embodiment.

Referring to FIG. 3, a diagram illustrating the phases of operation of an LBIST system in accordance with one embodiment is shown. FIG. 3 shows four different phases of operation of the LBIST system: initialization; compare; function; and scan shift. In the initialization phase, the various components of the system are prepared for operation. In the compare phase, operation of various components of the LBIST system is temporarily suspended in order to enable comparison of actual and expected signature data. In the functional phase, data is propagated through the functional logic of the device in which the LBIST system is implemented. In the scan shift phase, data is scanned into, through, and out of the scan chains of the LBIST system.

Operation of the LBIST system begins with the initialization phase 310. The system is prepared for normal operation during this phase. It may be necessary to ensure that several registers and counters (e.g., function register, hold register, scan register, mode counter) have the appropriate values stored therein. It may also be necessary to reset various components, provide a seed for a pseudorandom number generator, and so on. Because the first test cycle 330 in the embodiment depicted in FIG. 3 begins with a functional phase 340, it is also necessary in the initialization phase to generate a first set of input test bit patterns and to load these bit patterns into the scan chains that are interposed between the functional logic of the device under test. Depending upon when the comparison and functional operations are performed in each test cycle, it may also be necessary to acquire the expected signature bit pattern in the initialization phase. After these operations are performed, the LBIST system is ready for operation, and the system enters a hold phase 320, during which the system waits for an indication that it should begin operation. The hold phase may not be used in alternative embodiments.

Following the initial hold phase 320, the LBIST system begins a first test cycle 330 that includes a functional phase 340, a scan shift phase 350 and a compare phase 360. During the functional phase, the data that was scanned into the scan chains is propagated through the functional logic of the device under test. At the end of this functional phase, the output of the functional logic is captured by the scan chains. As noted above, a scan chain that is positioned between successive functional logic blocks serves to both provide inputs to one of the functional logic blocks and capture the outputs of the other of the functional logic blocks. The data that is captured in the scan chains at the end of the functional phase is scanned out of the scan chains during the scan shift phase. At the same time the captured data is scanned out of the scan chains, new input test bit patterns are scanned into the scan chains to prepare for the functional phase of the next test cycle. Also, a new expected signature bit pattern is loaded into the MISR. As the data is scanned out of the scan chains and into the MISR, a signature of the bit patterns is generated by the MISR. When the signature has been generated, it is compared to the expected signature bit pattern and a pass/fail bit is generated.

In this embodiment, when the captured data has been scanned out of the scan chains, the system enters a compare phase. During the compare phase, the functional and scan shift operations of the LBIST system are temporarily suspended. While these operations are suspended, the state of the system is maintained, so that the functional and scan shift operations can be resumed after the compare phase without having to re-initialize the system. During the compare phase, the signature generated by the MISR is examined to determine whether the functional logic blocks performed correctly. In one embodiment, the MISR is a self-compare MISR. In the self-compare MISR, the signature of the captured bits is compared to the expected signature already stored within the MISR. The expected data may, for example, comprise signature data from the MISR of an identical device ( a "good" device) that was operated with the same input as the device under test. The MISR generates a pass/fail bit that indicates whether the signatures match. If the signatures match, the device under test is operating properly, and the system proceeds to the next test cycle. If the signatures do not match, the device under test has malfunctioned, and operation of the system may either remain suspended or be halted to allow the malfunction to be diagnosed.

If the examination of the MISR signature (or other examination of the captured data) indicates that a malfunction has occurred in the device under test, diagnosis of the malfunction may proceed using the captured data, MISR data, or other data that may be available within the LBIST system. The specific means for acquiring and analyzing the data will not be discussed here, as they are beyond the scope of the present disclosure.

Figure 4:
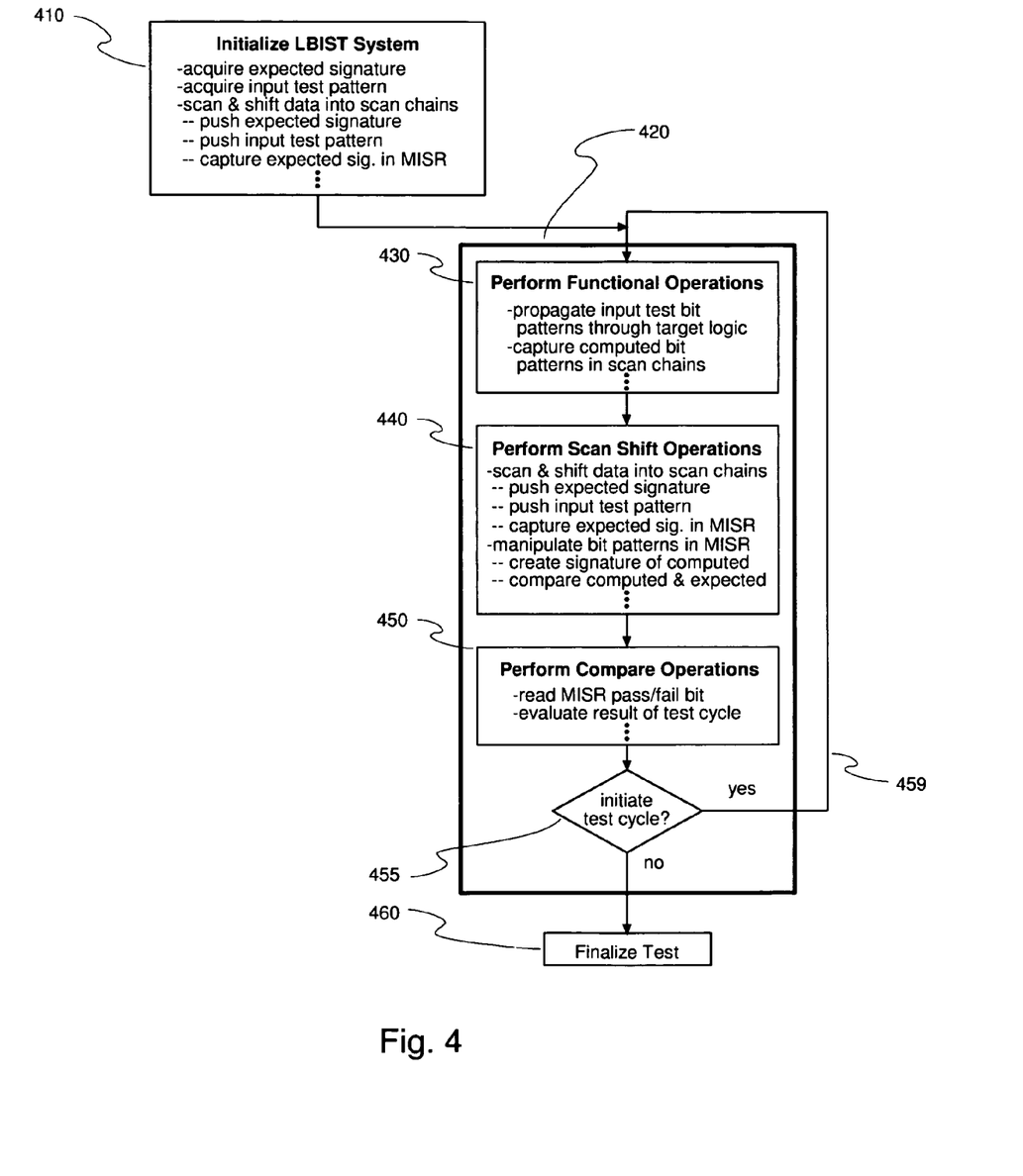
FIG. 4 is a diagram illustrating LBIST operations within different phases in accordance with one embodiment.

Referring to FIG. 4, operation of the system begins with the initialization of the LBIST components (block 410.) After the system is initialized, it executes a functional phase, including propagating data from the scan chains through the functional logic and capturing the resulting bit patterns in the scan chains (block 430.) Next, the system executes the scan shift phase, in which the captured bit patterns are scanned out of the scan chains while new input test bit patterns are scanned into the scan chains (block 440.) Then, the system enters a compare phase, in which the functional and scan shift operations of the system are suspended (block 450.) After the compare phase, the system determines whether execution of the LBIST testing will continue, or be suspended/halted (455.) If it is determined that the testing will continue (459), the system executes another test cycle consisting of a functional phase (block 430,) a scan shift phase (block 440) and a compare phase (block 450.)

Operation of the system within the compare phase in one embodiment begins with the reading of the pass/fail bit out of the MISR (block 450.) This pass/fail bit is the result of comparing signature data. The signature data associated with the computed result is compared with the expected signature data. This expected data can be acquired from an identical device that is known to operate properly. In one embodiment, if the two signatures match, the pass/fail bit is 1 (one) and the LBIST testing continues If the two signatures do not match, the pass/fail bit is 0 (zero) and the LBIST testing may be terminated. If details beyond the existence of a malfunction are required, further analysis would be needed to determine the source of the error. The value of the pass/fail bit, indicating a passing or failing of the test depends upon the particular implementation of the MISR. The use of an AND gate would typically imply that 1 (one) indicates "pass" and that 0 (zero) indicates fail. The use of alternative elements may alter this (and, certainly, the complement/negation of the bit can be employed to produce the desired values).

It should be noted that this embodiment compares the data generated within the LBIST system of the DUT with corresponding data generated by a good device. Alternative embodiments may determine in other ways whether or not the data generated by the DUT contains errors. For example, the comparison data may be "live" or it may have been previously generated by a good device and then stored in a memory. The "live" comparison has the advantage of providing as little or as much data as is needed. For instance, the live comparison could continue to provide data for LBIST testing that continued for an indefinite period of time.

Figure 5:
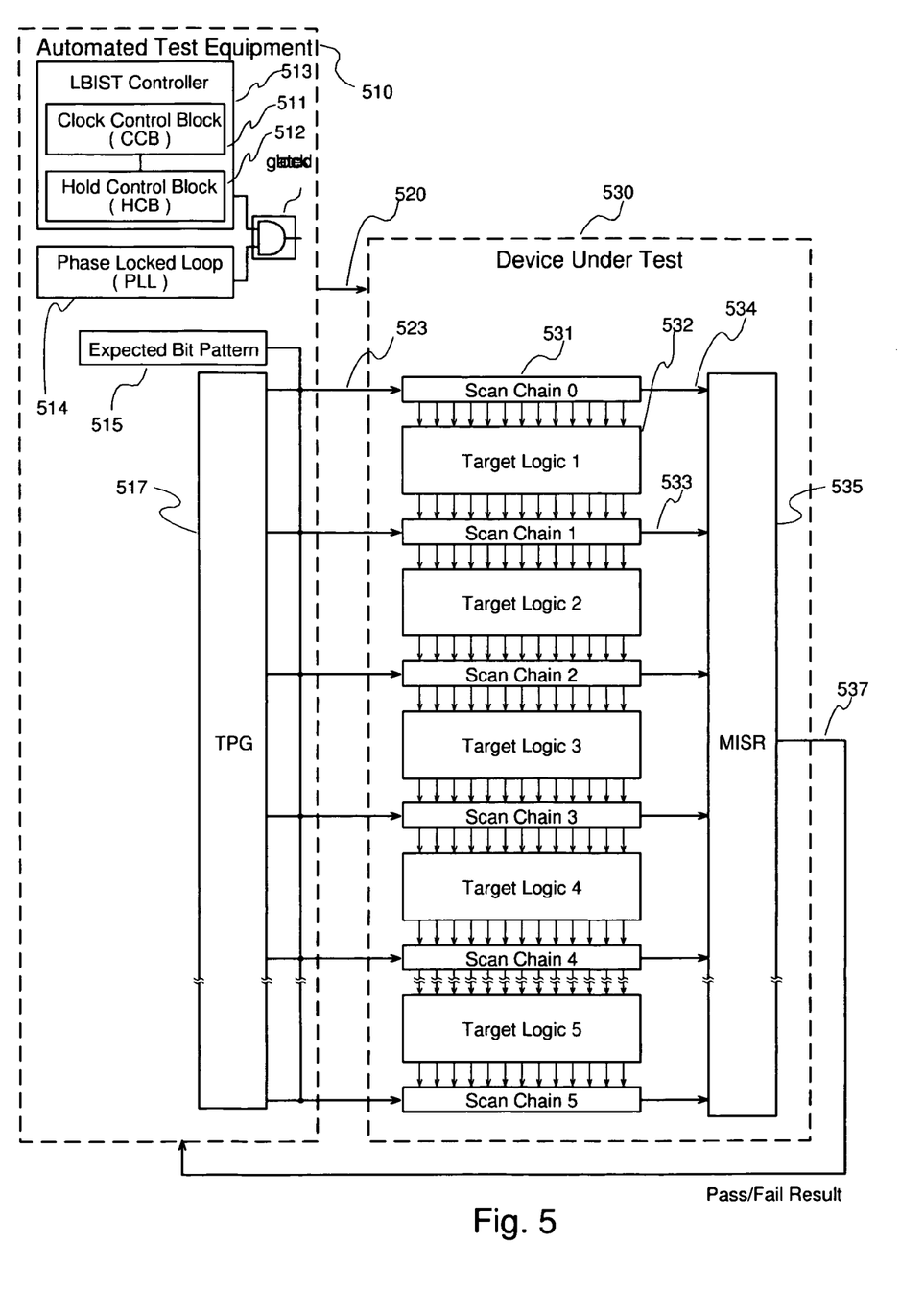
FIG. 5 is a functional block diagram illustrating an LBIST architecture that can be used in conjunction with the testing of logic circuits in accordance with one embodiment.

In one embodiment, the LBIST system is implemented as shown in the functional block diagram of FIG. 5. As depicted in FIG. 5, the STUMPS architecture comprises an LBIST controller 513, means for providing expected bit pattern signatures 515, a test pattern generator (TPG) 517 (e.g., a pseudorandom pattern generator), a set of scan chains, e.g. 531, and a MISR 535. These LBIST components are integrated with a logic circuit which the LBIST components are designed to test. It should be noted that, while only six scan chains are depicted in FIG. 5, there may be many scan chains in the LBIST design. Also, only one DUT is depicted, though multiple DUTs may be connected to and tested by an ATE.

The operation of LBIST components is controlled by LBIST controller 513, which generates the control signals necessary to execute the phases of operation depicted in FIG. 3 (i.e., the initialization, function, scan shift and compare phases.) The generation of these control signals is performed in this embodiment by clock control block 511, based upon a clock signal generated by PLL 514.

LBIST controller 513 includes control circuitry that controls the operation of the remainder of the LBIST components. (For purposes of clarity, LBIST controller 513 is not depicted as being connected directly to each of the components. The connections with the "on-chip" components is represented here by 520, as are all of the support signal for the DUT which are provided by the ATE.) One of the functions of LBIST controller 513 is to provide any needed initial data to the test pattern generator (e.g., a seed value to TPG). Based upon these values, the input pattern generator generates a sequence of bits that are loaded into the scan chains (0-4.) Scan Chain 5 is not used to input data into the functional logic, though it may be used to convey data into the MISR.

The purpose of the sequence of bits generated by TPG 517 is to provide a set of input bits to be propagated through the functional logic components of the target logic circuits 1-5. The input sequences are therefore provided to each of scan chains 0-4. One example of a TPG is a pseudorandom pattern generator PRPG which can be implemented as a linear feedback shift register (LFSR).

The input bit patterns that are generated by TPG 517 are loaded into scan chains 0-4 (e.g. through 523.) Each of scan chains 0-5 comprises a series of scan latches that are configured to alternately shift data (the input test bit patterns, expected signature, or functional logic output) through the scan chains, or to hold data that has been propagated through the functional logic. Each of the scan chains is positioned before or after (interposed with) respective portions of logic circuit. Thus, for each portion of logic circuit, there is a scan chain which precedes this portion and provides inputs to the corresponding logic, as well as a scan chain which follows this portion and receives the output of the corresponding logic. For example, one portion of the logic circuit (Target Logic 1) may receive input bits from Scan Chain 0 and provide output bits to Scan Chain 1. Another portion of the logic circuit (Target Logic 2) may receive input bits from Scan Chain 1 and provide output bits to Scan Chain 2. Some of scan chains may serve both to provide input bits to a succeeding portion of the logic circuit and to receive output bits from a preceding portion of the logic circuit.

After the input test bit patterns have been allowed to propagate through the functional components of Target Logic 1-5 and the results have been captured in scan chains 1-5, the contents of scan chains 1-5 are scanned out of the scan chains (i.e., they are unloaded from the scan chains) to MISR 535.

MISR 535 provides a means to compare the actual output of the target logic to the expected output of the target logic. Typically, MISR 535 enables the observation of a cumulative value that is based upon the output of the scan chains at each cycle. For example, in one embodiment, MISR 535 performs a modulo operation on the output of the scan chains. That is, MISR 535 divides the current value stored in MISR 535 by the output of scan chains 1-5, and retains the remainder from this computation. This computation is performed, and the value stored in MISR 535 is updated, after each functional cycle. In another embodiment, a data signature is constructed by performing XOR operations between the bits of the output of the scan chains and the bits of an accumulation of previous operations.

Here, in addition to generating a signature of the computed bit patterns, the MISR also performs a comparison with an expected signature. In this embodiment, ATE 510 conveys the expected bit pattern from expected bit pattern generator 515 by the same means as TPG 517 inputs test bit patterns—through the scan chains. In preparation for a comparison with computed bit patterns, the expected bit patterns are loaded into scan chains 1-5 prior to the input bit patterns. A register associated with each of the active scan chain outputs is provided in the MISR to hold a bit of the expected signature. (e.g., see FIG. 6, 620.) This allows the signature of the computed bit pattern calculated in MISR 535 to be compared to the expected value. If the calculated signature does not match the expected value, then one or more of the operations performed by the functional components of the logic circuit failed. An incorrect data bit in the output scan chain is consequently generated. This bit propagates to MISR 535, alters the signature of the computed bit pattern, and is detected when compared to the expected signature. This pass/fail bit is available from MISR 535 by means of signal line 537. Also, see FIG. 6, 690. (Regarding the expected signature, it should be noted that the bits that are entered into the scan chains, and subsequently into the MISR, represent the expected signature, and may have to be transformed to conform to the circuitry. That is, the complement may have to be used and the locations of the bits shifted to accommodate the circuitry.)

Figure 6:
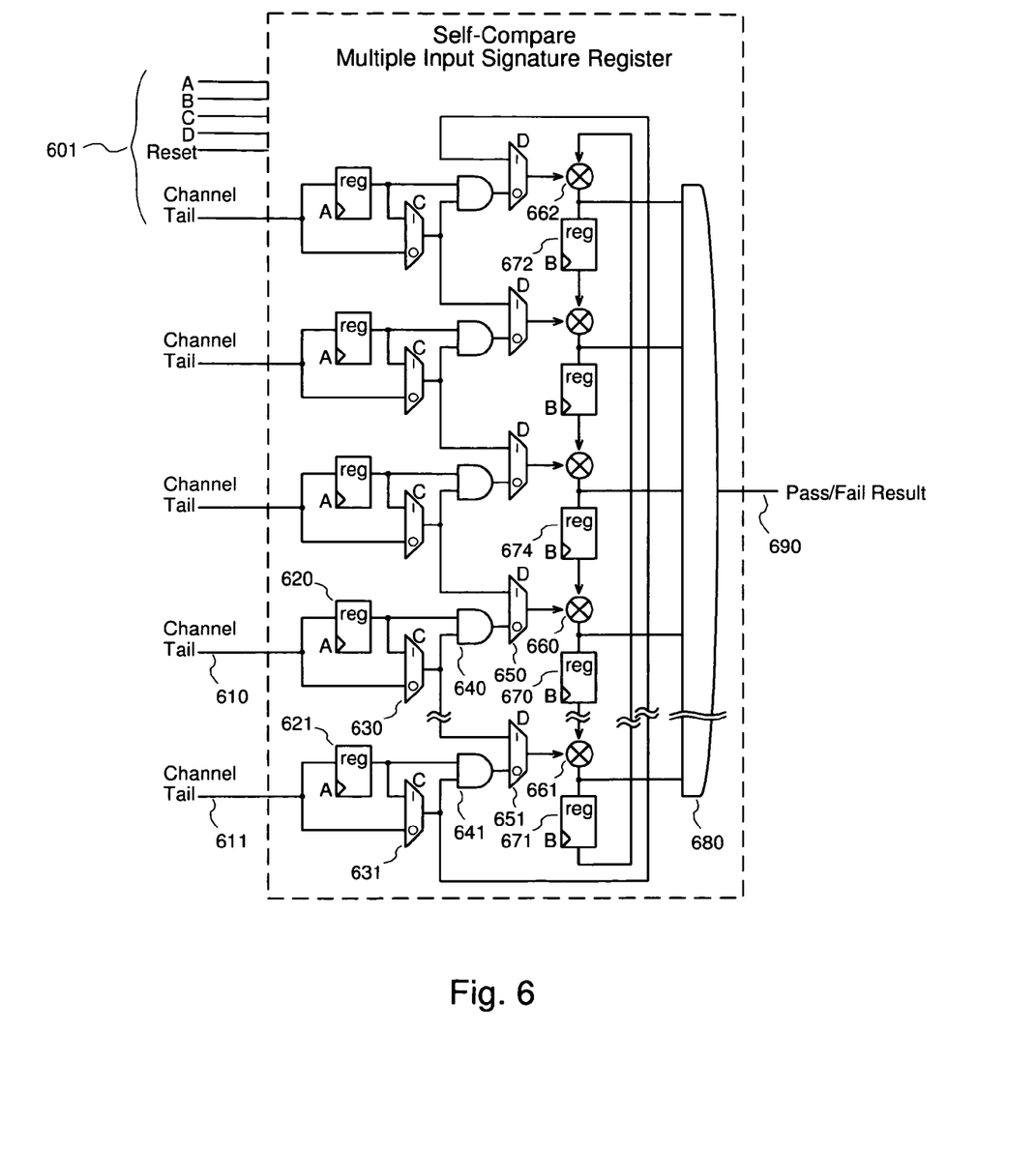
FIG. 6 is a functional block diagram illustrating the structure of a self-compare MISR in accordance with one embodiment.
Figure 8A:
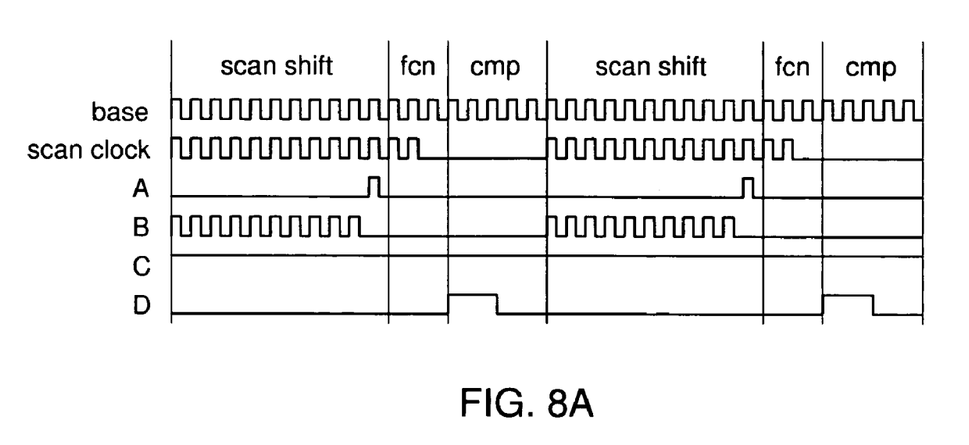
FIGS. 8A and 8B are a pair of timing diagrams illustrating register values and signals associated with the embodiments of FIGS. 6 and 7, respectively.

Referring to FIG. 6, a diagram illustrating a self-compare MISR configured to calculate a signature of the output of the functional logic and compare the result with an expected result is shown. The MISR receives input signals A, B, C, D, and Reset (601) as well as bit sequences from the scan chains. (It should be noted that the timing of the signals used in the self-compare mode of the MISR is shown in FIG. 8A.) The bit sequences (channel tails) are loaded into the MISR from the scan chains and consist of either expected signature bits or computed bit patterns. The expected signature bits are captured and stored to be used later to determine if the tested logic has failed. The computed bit patterns are compressed in one embodiment by means of exclusive ORs (XORs) to create a signature of the patterns.

The self-compare MISR circuit employs latches RegA and RegB (e.g. 620 and 670, respectively,) multiplexers MuxC and MuxD (e.g. 630 and 650, respectively,) AND gates (e.g. 640,) XOR gates (e.g. 660,) and a many-input AND gate 690.

A Reset signal is used to initialize latches in preparation for creating the computed bit pattern signature. The RegB latch is reset to 0 (zero) so the first computed bit, XOR'd with zero, results in itself.

As mentioned above, there are two types of data entering the MISR from the bit streams—bits of the computed patterns and bits of the expected signatures. The paths these different types of bits take through the MISR are themselves different. Bits from the computed patterns follow paths similar to each other from their respective scan chains. These computed bits are used in the formation of a signature for the computations from the functional phase which is accumulated in the latches RegB (e.g. 670.)

The signature of the computed bit patterns is stored in the latches RegB (e.g. 670.) Each incoming calculated bit is XOR'd with the contents of its neighboring RegB latch. When the incoming bit on line 610 is a computed bit, signals A and C are not asserted, signal D is asserted and the bit passes from the signal line (e.g., line 610,) through the MuxC (e.g., 630) to the MuxD (e.g., 651) to the XOR gate (e.g., 661,) where it is XOR'd with the contents of the RegB (e.g., 670.) Signal B is also asserted and the XOR result is stored in the RegB (e.g., 671.) This result is then XOR'd (e.g., at 662) with the next bit received on the adjacent signal line (e.g., 611,) the result of which is stored in the RegB (e.g., 672,) and so on. This occurs simultaneously for all input bit streams at all the appropriate gates, forming the signature of the output of the functional logic.

Bits from the expected signature are stored in the latches (RegA) associated with their respective scan chains and, at the appropriate time, are propagated to the respective XOR gates to be used in a signature comparison.

In the embodiment of FIG. 6, signal A would be asserted when a bit that is part of the expected signature is received from the channel tail. For example, if a bit is received on line 610 when signal A is asserted, it would be stored in RegA (620.) At the appropriate time, it can be used for a comparison. To execute that comparison, signals C and D are asserted and the bit is XOR'd at 661 with the contents of RegB (670.) All of the bits from the XOR gates are combined by AND gate 680 to create the pass/fail bit. This bit is available from AND gate 680 on line 690. If all of the bits of the MISR signature (stored in RegB's) match the expected bits (stored in RegA's,) then the result on line 690 is 1. In this embodiment, signal B is not asserted so that the results of the bit comparisons are not stored in the MISR RegB's.

The MISR as depicted in FIG. 6 has two modes. One is that of the self-compare MISR already described. The other is that of a more conventional MISR. In a conventional MISR, latches corresponding to RegA are not connected to the incoming bit stream (the channel tail) but instead have values which are set during the initialization phase and remain unchanged for the duration of the testing. These latches are used as masks to select which of the bit streams are used in the construction of the computed signature. In the present embodiment, this same functionality is provided by RegA, which can be loaded with a bit that is received via the channel tail. For example, a bit entering at 610 would be AND'ed at 640 with the contents of RegA 620 and then XOR'd into the signature at 660 with the result stored in RegB 670. This would be accomplished by asserting signal B and not asserting signals C and D (and A).

While the foregoing description presents several specific exemplary embodiments, there may be many variations of the described features and components in alternative embodiments.

In at least one embodiment, there exists a dedicated connection to convey the pass/fail bit to the ATE. Alternatively, each DUT may have a shared connection that is used during a short interval in each test cycle to convey the pass/fail bit to the ATE and is otherwise used for conveying input to the DUT, further reducing the number of required connections.

It should be noted that the MISR output need not be read in every test cycle. In alternative embodiments, tThe pass/fail bit may be read after multiple test cycles, or even after completion of all test cycles, as may be appropriate for a particular test scenario.

The embodiments described above compare each bit in the MISR to an expectation bit and generate either a 1 to indicate correct operation, or a 0 to indicate a failure. An AND gate is then used to detect failures (0's) and to generate a pass/fail signal (0 indicating failure and 1 indicating correct operation.) Alternative embodiments my employ a other components to perform these functions. For example, the AND gate may be replaced by an OR gate. In this case, each bit in the MISR is compared to an expectation bit and either a 0 (indicating correct operation) or a 1 (indicating a failure) is generated. An OR gate is then used to detect failures (1's) and to generate a pass/fail signal (0 indicating correct operation and 1 indicating failure.)

The computed output bits scanned from the scan chains may be compacted, providing a Channel Tail that is not the direct result of passing through the functional logic. The purpose of compacting is simply to reduce the number of bits that have to be handled by the MISR. A compactor may be implemented in a number of ways. Typically, compacting will employ a series of XOR gates, where the output of each XOR gate is based upon inputs received from a pair of scan chains. The number of bits that are then passed to the MISR can therefore be reduced by a factor of 2. In alternative environments, more complex circuitry may allow the number of bits to be reduced by an even greater factor. The expected signature bits may have to be altered to account for compacting.

Figure 7:
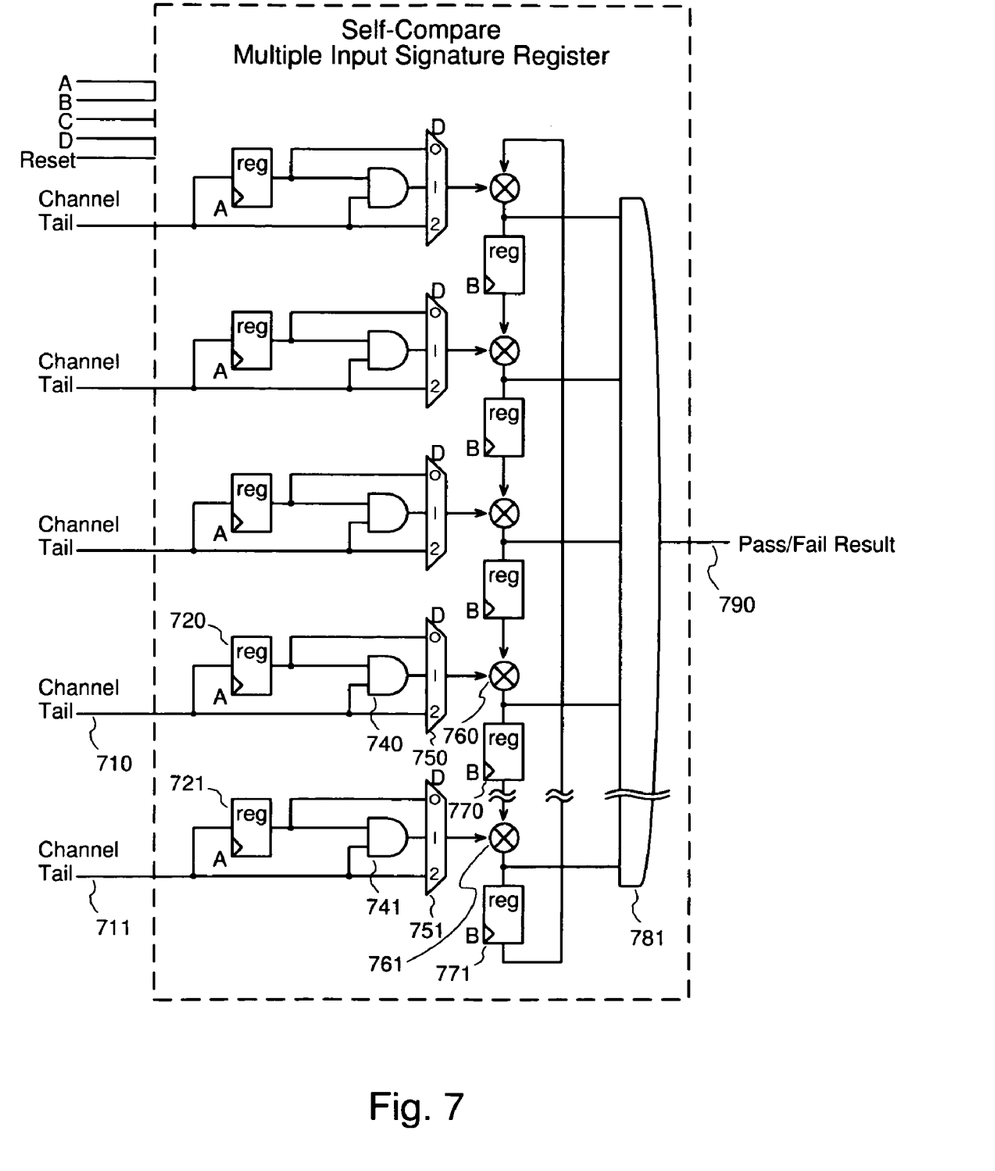
FIG. 7 is a functional block diagram illustrating the structure of a self-compare MISR in accordance with an alternative embodiment.

Referring to FIG. 7, a diagram illustrating an embodiment of a self-compare MISR is shown. This configuration of the self-compare MISR can perform the same functions as the configuration of FIG. 6, but utilizes a different set of components between the channel tails and the signature registers (RegB) to achieve the desired functionality.

In the configuration of FIG. 7, the bit received from each channel tail is provided to a corresponding mask register (RegA, e.g., 720, 721,), an AND gate (e.g., 740, 741,) and one of the inputs (input 2) of a 3-way multiplexer (e.g., 750, 751.) The output of RegA is provided to the AND gate and also to another one of the inputs (input 0) of the 3-way multiplexer. The output of the AND gate is provided to another input (input 1) of the 3-way multiplexer. The output of the 3-way multiplexer is provided to an XOR gate (e.g., 760, 761,) and the output of the XOR gate is provided to RegB (e.g., 770, 771, 775.) The output of the XOR gate is also provided to AND gate 781, which generates a pass/fail signal on line 790, in the same manner as the configuration of FIG. 6.

Figure 8B:
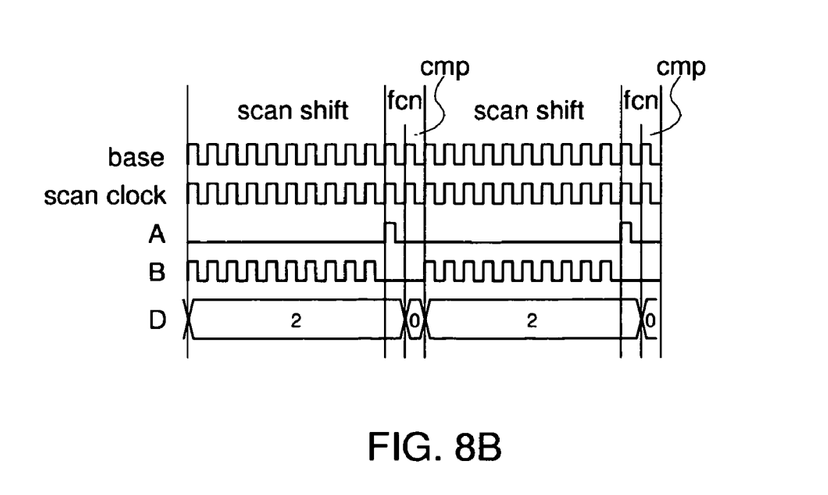

Similar to the configuration of FIG. 6, a pulse is provided to each RegA of the self-compare MISR of FIG. 7 (via signal A) when the expected bit to be compared to the actual MISR signature is received from the channel tail. This causes the expected bit to be stored in RegA. When it is desired to scan the computed bits out of the scan chains and pass them to the XOR gates, input 2 of the 3-way multiplexer is selected. The bits then pass from the channel tails, through the 3-way multiplexer to the XOR gates. When it is desired to compare the signature in the RegB's to the expected bits, input 0 of the 3-way multiplexer is selected. The contents of RegA are then provided to the XOR gate. If mask operation is desired, input 1 of the 3-way multiplexer is selected. In this case, the bits received from the channel tail are AND'ed with the contents of RegA before being passed to the XOR gate. (The timing of the signals identified in FIG. 7 is shown in FIG. 8B for the self-compare mode of the MISR.)

Many other variations will also be apparent to persons of skill in the art of the invention upon reading the present disclosure.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such any storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system comprising:
   a test bit pattern generator;
   a multiple input signature register (MISR);
   a plurality of scan chains interposed with functional logic of a device under test and coupled between the test bit pattern generator and the MISR;
   wherein the scan chains are configured
      to receive test bit patterns from the test bit pattern generator
      to temporarily store the test bit patterns and provide the test bit patterns to the functional logic,
      to capture computed bit patterns that have propagated through the functional logic, and
      to provide the computed bit patterns and one or more expected bit patterns to the MISR; and
   wherein the MISR is configured
      to generate one or more accumulated signature bit patterns based on the computed bit patterns,
      to compare the accumulated signature bit patterns to the corresponding ones of the expected bit patterns, and
      to generate a pass/fail signal based upon comparisons of the accumulated signature bit patterns and the expected bit patterns.

2. The system of claim 1, further comprising a first set of registers in the MISR that are configured to receive the bits of the expected bit pattern from the scan chains and to store the bits of the expected bit pattern.

3. The system of claim 2, wherein the system is configured to operate alternately in either of a self-compare mode and a mask mode, wherein in the self-compare mode the system is configured to periodically compare bits of the accumulated signature bit pattern to the corresponding bits of the expected bit pattern, and wherein in the mask mode the system is configured to mask bits of a first set of the scan chains and to unmask bits of a second set of the scan chains, and to combine bits of the second set of the scan chains, but not the first set of scan chains, with existing signature bit patterns to generate the accumulated signature bit patterns.

4. The system of claim 3, wherein the system is configured to load an initial signature bit pattern in the MISR prior to generating any accumulated signature bit patterns and to thereafter operate alternately in either the self-compare mode or the mask mode.

5. The system of claim 1, wherein the system is configured to compare the accumulated signature bit patterns to the corresponding ones of the expected bit patterns and to generate the resulting pass/fail signal once for each test cycle, wherein the system is configured to perform multiple test cycles during an LBIST test.

6. A self-compare multiple-input signature register (MISR) comprising:
 a plurality of inputs configured to receive bits from a plurality of corresponding scan chains;
 a plurality of registers configured to receive expected bits from the scan chains via the inputs and to store the expected bits;
 a plurality of latches configured to store accumulated signature bits;
 first circuitry configured to modify the accumulated signature bits according to bits received from the scan chains; and
 comparison circuitry coupled to the latches, wherein the comparison circuitry is configured to
  compare the expected bits to the accumulated signature bits, and
  generate a pass/fail signal based upon the comparison of the expected bits to the accumulated signature bits.

7. The MISR of claim 6, further comprising a first set of registers that are configured to store the expected bits.

8. The MISR of claim 7, wherein the MISR is configured to operate alternately in either of a self-compare mode and a mask mode, wherein in the self-compare mode the system is configured to periodically compare the accumulated signature bits to the corresponding expected bits, and wherein in the mask mode the system is configured to mask bits of selected ones of the scan chains and to use the masked bits to generate the accumulated signature bits.

9. The MISR of claim 8, wherein the system is configured to load an initial set of signature bits in the MISR prior to generating any accumulated signature bits and to thereafter operate alternately in either the self-compare mode or the mask mode.

10. The MISR of claim 7, further comprising a plurality of XOR gates, wherein each of the XOR gates is positioned between a pair of the latches including a preceding latch and a following latch, wherein a first input of the XOR gate is configured to receive an output of the preceding latch and a second input of the XOR gate is configured to selectably receive one of: a captured bit received from one of the scan chains; and an expected bit stored in one of the first set of registers.

11. The MISR of claim 7, further comprising a plurality of AND gates, wherein for each AND gate, a first input of the AND gate is coupled to a corresponding one of the first set of registers to receive a mask bit and a second input of the AND gate is coupled to a corresponding one of the inputs to receive bits from a corresponding one of the scan chains.

12. The MISR of claim 7, further comprising a plurality of AND gates, wherein for each AND gate, a first input of the AND gate is coupled to a corresponding one of the first set of registers and a second input of the AND gate is coupled to an output of a corresponding multiplexer, wherein a first input of the multiplexer is coupled to a corresponding one of the scan chains and a second input of the multiplexer is coupled to the corresponding one of the first set of registers.

13. The MISR of claim 6, wherein the comparison circuitry is configured to compare the expected bits to the accumulated signature bits once for each test cycle, wherein the system is configured to perform multiple test cycles during an LBIST test.

14. A method comprising:
 generating a plurality of signature bits in a self-compare multiple-input signature register (MISR);
 receiving a plurality of expected bits in the MISR from a plurality of corresponding scan chains, wherein each of the expected bits corresponds to one of the signature bits;
 comparing in the MISR each of the expected bits to the corresponding ones of the signature bits; and
 generating a pass/fail signal in the MISR based upon the comparison of the expected bits to the accumulated signature bits.

15. The method of claim 14, further comprising storing the expected bits that are received from the scan chains in a first set of registers in the MISR.

16. The method of claim 15, further comprising operating alternately in either of a self-compare mode and a mask mode, the self-compare mode including periodically comparing the accumulated signature bits to the corresponding expected bits, and the mask mode including masking bits of selected ones of the scan chains, unmasking bits of unselected ones of the scan chains, and using the unmasked bits, but not the masked bits, to generate the accumulated signature bits.

17. The method of claim 16, further comprising loading an initial set of signature bits in the MISR prior to generating any signature bits and thereafter operating alternately in either the self-compare mode or the mask mode.

18. The method of claim 14, wherein comparing each of the expected bits to the corresponding ones of the signature bits is performed once for each test cycle, and performing multiple test cycles during an LBIST test.

\* \* \* \* \*